United States Patent
Beauchamp et al.

(10) Patent No.: US 6,459,616 B1
(45) Date of Patent: Oct. 1, 2002

(54) SPLIT COMMON SOURCE ON EEPROM ARRAY

(75) Inventors: Bruce Beauchamp; Tom Salt, both of Gilbert, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 09/799,328

(22) Filed: Mar. 5, 2001

(51) Int. Cl.[7] .............................................. G11C 16/04
(52) U.S. Cl. ............................. 365/185.11; 365/185.05; 365/185.23
(58) Field of Search ...................... 365/185.11, 185.05, 365/185.23

(56) References Cited

U.S. PATENT DOCUMENTS 6,014,328 A * 1/2000 Onakado et al. ....... 365/185.05
6,091,634 A * 7/2000 Wong .................... 365/185.14
6,195,285 B1 * 2/2001 Yamamoto et al. .... 365/185.11

* cited by examiner

Primary Examiner—Huan Hoang
(74) Attorney, Agent, or Firm—Baker Botts L.L.P.

(57) ABSTRACT

An EEPROM having reduced circuit loading of a high voltage write pulse by dividing an array of bit cells into two or more switchable common source segments. Only common source segments containing the bit cells being written to are connected, the other common source segments remain unconnected and do not contribute substantially to loading of the write pulse. Having multiple switchable common segmentations reduces the amount of parasitic capacitance connected in the EEPROM array during a write operation, thus reducing loading on the write circuits. Also reducing the number of bit cells having the common source segments connected during a write operation reduces the amount of leakage current contribution which adversely affects the write operation.

30 Claims, 4 Drawing Sheets

SPLIT COMMON SOURCE ON EEPROM ARRAY

FIELD OF THE INVENTION

The present invention relates generally to Electrically Erasable Programmable Read Only Memory (EEPROM), and more particularly to an EEPROM array having a split common source for reducing Vpp loading during programming memory bit cells of the EEPROM array.

BACKGROUND OF THE INVENTION TECHNOLOGY

EEPROM is a class of nonvolatile semiconductor memory in which information may be electronically programmed into and erased from each memory element or bit cell. Each bit cell of the EEPROM comprises two metal oxide semiconductor field effect transistors (MOSFET), one of the MOSFETs has two gates and is used to store the bit information, and the other MOSFET is used in the selection of the bit cell. Illustrated in FIG. 1a is a cross-section elevation view of a semiconductor integrated circuit bit cell 200 comprising a storage MOSFET 202 having two gates, a memory cell gate 102 and a floating gate 104, one above the other. A source well 108 and common drain/source well 118 make up the remaining elements of the MOSFET 202. A row select MOSFET 204 comprises the common drain/source well 118 and a drain well 110. FIG. 1b is a schematic diagram of the bit cell 200 illustrated in FIG. 1a. The gates 102, 104 and 112 may be poly-silicon or other conductive material. The lower gate 104 is surrounded by an oxide 114 and is thereby insulated from and unconnected to any voltage or other element of the bit cell MOSFET 200. The double gate MOSFET 202 is called a "floating-gate tunneling-oxide" or FLOTOX EEPROM.

FIG. 2 is a schematic diagram illustrating a portion of a typical prior art EEPROM comprising a plurality of bit cells 200 arranged in a matrix array. The memory element or bit cell generally indicated by the numeral 200 may be read from, written to, erased, or put in standby according to Table I below:

TABLE I

|  | Read | Write | Erase | Standby |
|---|---|---|---|---|
| Bit Line | ~1.6 volts | $V_{pp}$ | 0.0 volts | 0.0 volts |
| Row Select Gate | $V_{DD}$ | $V_{pp+}$ | $V_{pp+}$ | 0.0 volts |
| Memory Cell Gate | ~1.1 volts | 0.00 volts | $V_{pp}$ | 0.0 volts |
| Common Source | 0.0 volts | Float | 0.0 volts | 0.0 volts |

$V_{DD}$ may be generally from about 5.0 volts but may be in the one volt range depending upon the operation of the EEPROM. Vpp may be generally from about 18–23 volts. Vpp+ may be generally from about 21–25 volts.

To erase or write to a bit cell 200, the row select transistor must have a relatively high potential pulse of Vpp+. The Vpp+ pulse, and any other high potential voltages required, may be internally generated in the EEPROM integrated circuit by a charge pump, with the only other external voltage required being $V_{DD}$. Vpp may be derived form Vpp+ and is therefore part of the load on the charge pump. The only difference between an Erase and a Write is the direction of the applied field potential relative to the floating gate 104. The high voltage Vpp+ pulse may be from about 0.1 to 10 milliseconds.

For example, when Vpp is applied to the memory cell gate 222b and 0 volt is applied to bit line drain (column) 230c, electrons tunnel from the substrate 106 through the dielectric oxide 114 to the floating gate 104 until the floating gate 104 is charged. The cell 200 is now at an Erase state of logic 1. When 0 volt is applied to the memory cell gate 222b and Vpp is applied to bit line drain (column) 230c, electrons tunnel from the floating gate 104 through the dielectric oxide 114 to the substrate 106 until the floating gate 104 is discharged. The cell 200 is now at a Write state of logic 0. This sequence of transferring charge onto the floating gate 104 (Erase) and the removal of the charge therefrom (Write) is one Erase/Write cycle, or "E/W cycle." Incidental to writing the bit cell 200, the source 108 is pulled high (to approximately 10 volts).

For reliable operation of an Erase/Write cycle to a bit cell(s), the Vpp+ pulse must charge up to its maximum value quickly. A finite amount of time at finite voltages are required to achieve "optimal" Erase and Write thresholds. If the Vpp+ pulse is too short and the voltage applied to the bit cell too low, the bit cell(s) 200 will not be programmed to the proper threshold, thereby degrading the reliability and robustness of data stored in the EEPROM.

The on-chip charge pump has limited charging capabilities to generate the Vpp+ pulse during a write operation. A significant amount of capacitance and cell leakage currents load the output of the charge pump. The capacitance comprises the parallel combination of the parasitic capacitance Cgs and Cds present at each of the MOSFETs 202 and 204 in the bit cell 200. The cell leakage is from imperfect insulation properties of materials used in fabrication of the EEPROM and elevated operating temperatures. Also, the array source 108 has a large amount of capacitance to the substrate which must be pulled high by the charge pump.

As EEPROM array bit densities increase, the on-chip charge pump of such a chip begins having trouble pulling the Vpp+ line to a reliable programming voltage during a write cycle. Attempts have been made to increase the drive (charging) capabilities of the charge pump so as to obtain the desired programming response time with a larger (higher capacitive) load. Also, attempts at reducing the Vpp+ leakage have been made to further reduce the loading of the charge pump during a write cycle. High drive capacity (stronger) charge pumps require more integrated circuit die area and/or more operating current. Reducing the bit cell device leakage currents would also require larger device structures with a resultant increase in die size. As higher bit capacity EEPROMs are being fabricated using smaller transistor structures, these attempts at improving cell writing reliability are counter productive or impossible to achieve.

SUMMARY OF THE INVENTION

The invention overcomes the above-identified problems as well as other shortcomings and deficiencies of existing technologies by providing an EEPROM bit cell array structure having the array source lines divided into two or more segments for reducing the bit cell loading of the Vpp+ pulse during a Write operation. These segments may be as small as only the bit cells being written to (one byte, word, etc.). The charge pump need only be connected to the bit cell segment being programmed. Segmentation of the common source reduces the amount of parasitic capacitance connected in the EEPROM array during a Write operation. Reducing the number of bit cells connected during a Write operation may further reduce the amount of leakage current contributions to a bit cell(s) in a segment(s). A further reduction in charge pump drive capacitance is feasible since a reduction of loading can be achieved through appropriate segmentation of the bit cell array devices.

Accordingly, an exemplary embodiment of the invention is directed to an electrically erasable and programmable read only memory (EEPROM), comprising a plurality of memory bit cells wherein said plurality of memory bit cells are divided into at least two groups of bit cells, each of said at least two groups of bits cells have a common circuit connection separate from the other ones of said at least two groups of bits cells, and at least two selection circuits, each of said at least two selection circuits connected to the common circuit connection of a respective one of said at least two groups of bit cells, wherein said at least two selection circuits are adapted for selecting one of said at least two groups of bits cells when performing an operation on at least one bit cell thereof.

In accordance with an exemplary embodiment of the present invention, the bit cell array of an EEPROM has connections to the sources of the transistor devices comprising the bit cells segmented into two or more separate circuits. This segmentation reduces charge pump loading during a write operation to a selected bit cell(s) by reducing the number of transistor devices that contribute parasitic capacitance and leakage currents to the load that the charge pump must drive during the write operation.

The common circuit connection may be a common source connection. The each of the at least two selection circuits may comprise at least one selection transistor connected to a respective one of the common source connections of the at least two groups of bit cells. The plurality of bit cells may comprise a storage transistor and a select transistor. The storage transistor may comprise a floating gate and a cell gate, the floating gate being located between the cell gate, a source and a common drain/source. The select transistor comprises a select gate, a drain and the common drain/source. The source of the storage transistor is connected to the common source connection of a one of the at least two groups of bit cells. The operation is selected from the group consisting of read, write, erase and standby.

A programming pulse may perform the operation on the at least one bit cell. The programming pulse may have a time duration of from about 0.1 to 10 milliseconds. The programming pulse may have an amplitude of from about 21 to 25 volts. The programming pulse may also have an amplitude of from about 18 to 23 volts.

An electron charge is stored on the floating gate of the storage transistor by connecting the source of said storage transistor and the drain of the select transistor to a power supply common voltage, and applying a programming pulse to the cell gate and the row select gate. The electron charge on the floating gate of the storage transistor is discharged by connecting the cell gate to a power supply common voltage, floating the source of the storage transistor and applying a programming pulse to the row select gate and the drain of said select transistor.

In addition, the present invention is also directed to a method of operation for an electrically erasable and programmable read only memory (EEPROM), said method comprising the steps of dividing a plurality of memory bit cells into at least two groups of bit cells, each of said at least two groups of bits cells having a common circuit connection separate from the other ones of said at least two groups of bits cells; and connecting each of at least two selection circuits to the common circuit connections of a respective one of said at least two groups of bit cells, wherein said at least two selection circuits are adapted for selecting one of said at least two groups of bits cells when performing an operation on at least one bit cell thereof.

The step of storing an electron charge on the floating gate of the storage transistor comprises the steps of applying a power supply common voltage to the source of the storage transistor and the drain of the select transistor, and applying a programming pulse to the cell gate and the row select gate. The step of discharging an electron charge on the floating gate of the storage transistor comprises the steps of applying a power supply common voltage to the cell gate, floating the source of said storage transistor and applying a programming pulse to the row select gate and the drain of said select transistor.

The step of performing the operation on the at least one bit cell may be done with a primary programming pulse (designated herein as Vpp+). The primary programming pulse may have a time duration of from about 0.1 to 10 milliseconds, and an amplitude of from about 21 to 25 volts. Other high potential pulse levels required will be less than Vpp+ but higher than $V_{DD}$ (normal operation drain voltage).

A technical advantage of the present invention is reduced loading of a charge pump resulting in faster rise times for write pulses in EEPROM. Another technical advantage is improved reliability of write operations in an EEPROM. Still another technical advantage is scalable bit cell arrays being driven by a low power charge pump write circuit. Another advantage is faster write times in high capacity EEPROM.

Features and advantages of the invention will be apparent from the following description of the embodiments, given for the purpose of disclosure and taken in conjunction with the accompanying drawings.

BRIEF DESCRIPTION OF THE DRAWINGS

A more complete understanding of the present disclosure and advantages thereof may be acquired by referring to the following description taken in conjunction with the accompanying drawings, wherein:

FIG. 1a is a schematic cross-section elevation of a EEPROM memory cell MOSFET;

FIG. 1b is a schematic diagram of the MOSFET depicted in FIG. 1a;

Figure 1:
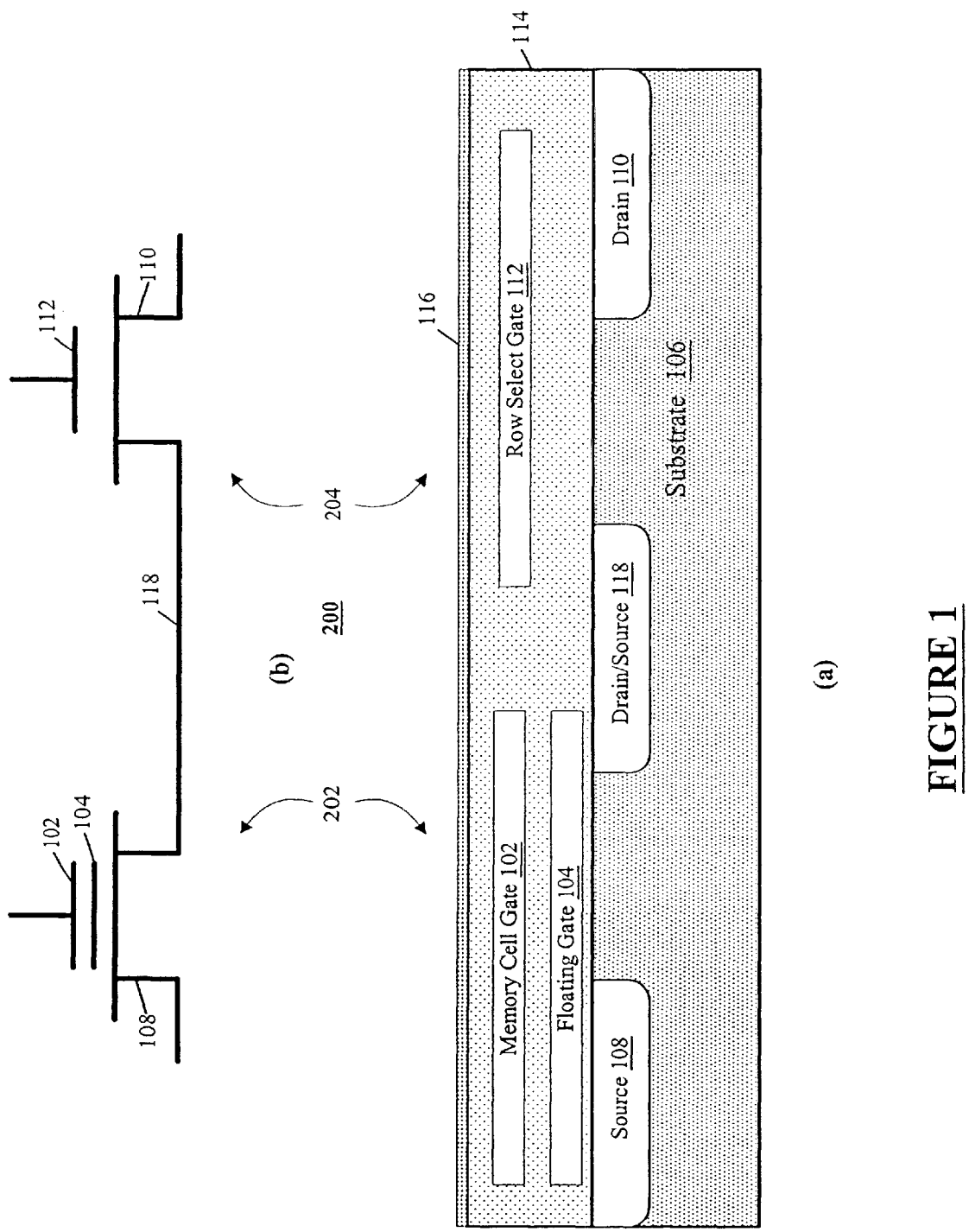

While the present invention is susceptible to various modifications and alternative forms, specific exemplary embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

The present invention is directed to a large scale EEPROM having reduced circuit loading of a high voltage write pulse during a write operation. The EEPROM of the present invention comprises a plurality of bit cells segmented into at least two different common source connections that may be independently selected during write operations. An unselected segment of bit cells does not substantially contribute parasitic capacitance nor leakage currents to the selected segment of the bit cells being written. Segmenting the common source connections for a plurality of bit cells enables a small and low power charge pump to be used for writing to the selected bit cells at a faster rate than could be done with a smaller EEPROM having only one common un-segmented source connection.

Referring now to the drawings, the details of an exemplary embodiment of the present invention is schematically illustrated. Like elements in the drawings will be represented by like numbers, and similar elements will be represented by like numbers with a different lower case letter suffix.

FIGS. 1a and 1b depict a schematic cross-section elevation of a EEPROM memory cell and a schematic diagram of the memory cell, respectively. The memory bit cell generally is depicted by the numeral 200 and comprises a floating-gate tunneling-oxide (FLOTOX EEPROM) 202 and a row select MOSFET 204. The MOSFET 202 has parasitic capacitance between the gate 102 and source 108, represented by $C_{gs}$, and parasitic capacitance between the drain/source 118 and the source 108, represented by $C_{ds}$. Also inherent in the structure of the MOSFET 202 are leakage currents between the gate 102, source 108 and drain/source 118. The floating gate 104 is insulated from the other elements of the MOSFET 202 by an insulating oxide layer 114. A passivation layer 116 is disposed over the oxide layer 114.

Figure 3:
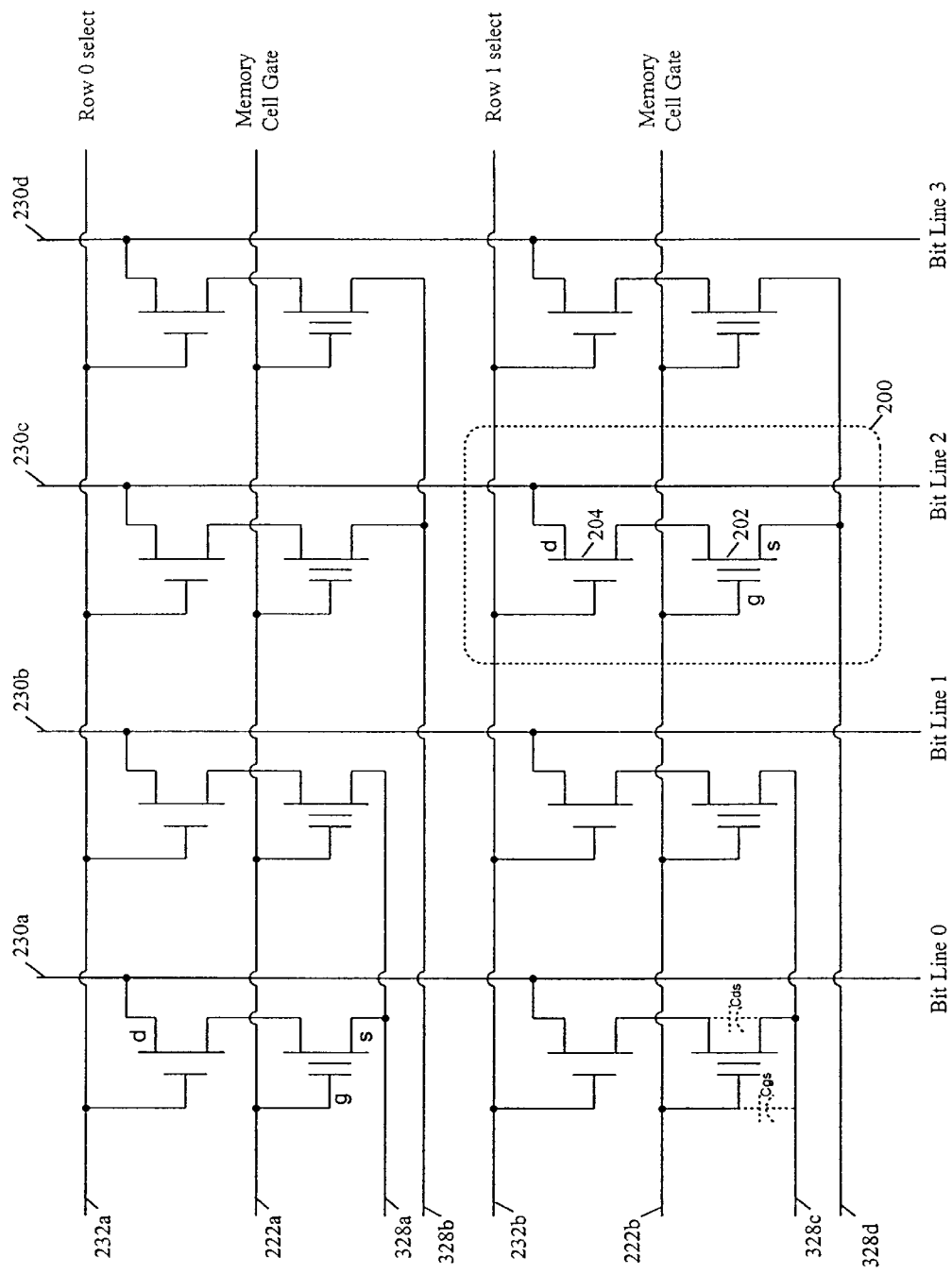
FIG. 3 is a schematic diagram of EEPROM bit cells connected according to an exemplary embodiment of the present invention.

Referring to FIG. 3, depicted is a schematic diagram of an exemplary portion of the array of EEPROM bit cells connected according to an exemplary embodiment of the invention. The present invention is has the MOSFET sources of at least two groups of bit cells isolated and selectably connectable. In the exemplary embodiment illustrated in FIG. 3, un-selected bit cells are not part of a selected bit cell(s) write circuit. Since the sources of the un-selected bit cells are "floating" (disconnected) any capacitance contribution and/or leakage currents are minimal. The circuits used to isolate the un-selected bit cells have parasitic capacitance and leakage currents, but are minimal compared to the capacitance and leakage currents of a plurality of bit cell MOSFETs. The bit cell source isolation circuits are in series with the bit cells and thus further reduce any parasitic capacitance (capacitors in series have less capacitance than either capacitor). Any leakage currents would generally be governed by the leakage current of the source isolation circuits.

In the exemplary embodiment depicted in FIG. 3, a bit cell 200 is selected for a write operation by applying a low logic level or common reference voltage to cell source enable line 328d, memory cell gate 222b is set to $V_{SS}$. Then a short, e.g., 1–10 millisecond Vpp+ write pulse is applied. Simultaneously, a short 1–10 millisecond Vpp pulse is applied to row 1 select line 232b. The un-selected bit cells have their respective source enable lines 328a, 328b and 328c floating and no longer tied to the selected source enable line 328d. Thus there is substantially no loading of the Vpp+ pulse by these un-selected bit cells.

Figure 2:
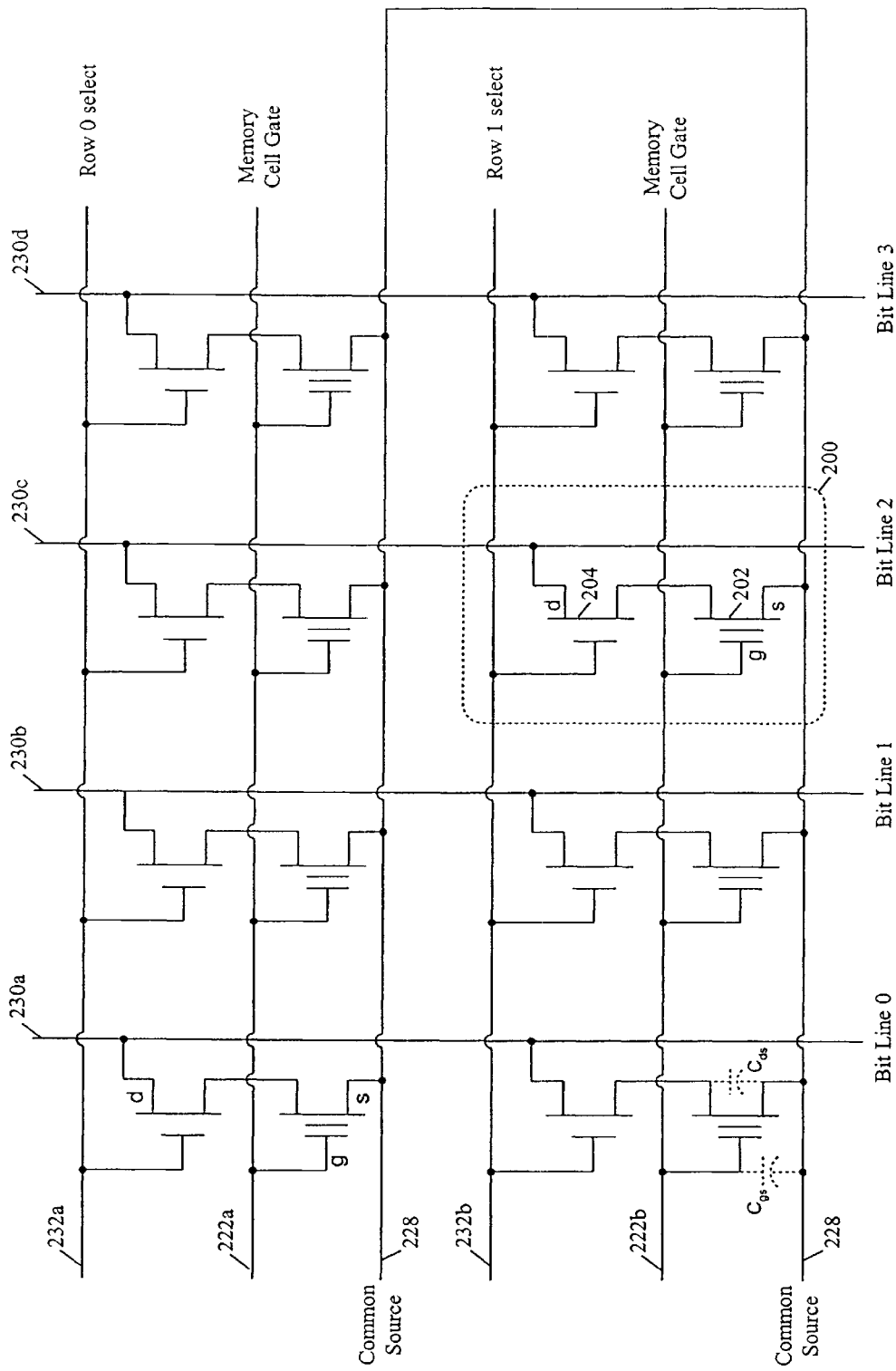
FIG. 2 is a schematic diagram of prior art EEPROM bit cells.

Parasitic capacitance, $C_{ds}$ and $C_{gs}$, and leakage currents affect the rise time and ultimate voltage level of the Vpp+ write pulse. The prior art circuit of FIG. 2 has all of the source connections of the bit cells connected to a common node (ground) and are potentially active circuit elements. Thus the parasitic capacitance and leakage currents of the entire array of bit cells are part of the active circuit loading that the charge pump (not illustrated) and write logic (not illustrated) must overcome in order to reliably write to the selected bit cell 200. Increasing the number of bit cells 200 increases the circuit loading that the Vpp+ write pulse must overcome.

Figure 4:
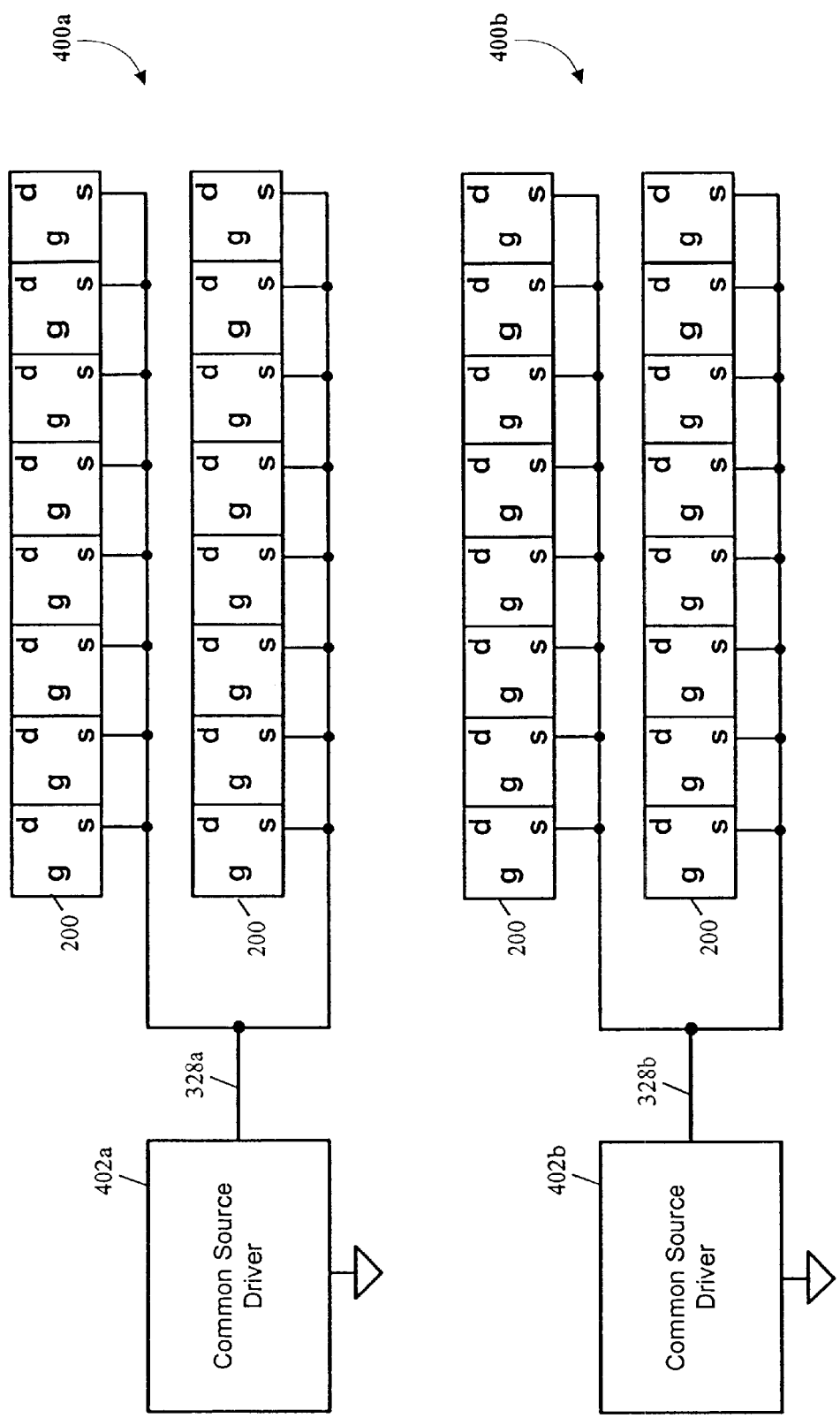
FIG. 4 is a schematic block diagram of a portion of an EEPROM according to the exemplary embodiment of the present invention.

An advantage of the present invention is that EEPROM storage capacity (number of data bits stored) can be substantially increased without having to increase the driving capacity of the write circuits, charge pump, etc., by just increasing the number of bit cell groups, e.g., keep the same number of source enabled bit cells during a write operation. FIG. 4 illustrates a schematic block diagram of an exemplary embodiment of the invention. A plurality of bit cells 300 are grouped into at least two bit cell blocks 400a and 400b. Common source drivers 402a and 402b, respectively, select one of the bit cell blocks 400a and 400b during a write operation. The other bit cell block remains unselected and thus does not substantially contribute to loading of the write pulse Vpp+. The common source drivers 402a and 402b may be, e.g., MOSFET or CMOS transistors (not illustrated) connected between the common sources of the bit cells and $V_{SS}$ (power supply common).

Tests have shown that reducing the capacitive loading on Vpp (Vpp may be derived from Vpp+) has increased the time Vpp is at its maximum level by over 100 microseconds for 1.8 volt operating EEPROM circuits. For higher voltage EEPROM circuits the reduction in rise time was not as significant, but an improvement was observed. EEPROMs having segmented common sources and operating at 1.8 volt $V_{DD}$ power supply voltage have achieved maximum Vpp voltage levels earlier which has resulted in a 17–28 percent longer pulse time at the maximum Vpp voltage level than has a prior art implementation of an EEPROM without common source segmentation.

The invention, therefore, is well adapted to carry out the objects and attain the ends and advantages mentioned, as well as others inherent therein. While the invention has been depicted, described, and is defined by reference to exemplary embodiments of the invention, such references do not imply a limitation on the invention, and no such limitation is to be inferred. The invention is capable of considerable modification, alternation, and equivalents in form and function, as will occur to those ordinarily skilled in the pertinent arts and having the benefit of this disclosure. The depicted and described embodiments of the invention are exemplary only, and are not exhaustive of the scope of the invention. Consequently, the invention is intended to be limited only by the spirit and scope of the appended claims, giving full cognizance to equivalents in all respects.

What is claimed is:

1. An electrically erasable and programmable read only memory (EEPROM) having reduced charge pump loading during a write operation using a high voltage, comprising:

a plurality of memory bit cells wherein said plurality of memory bit cells are divided into at least two groups of bit cells for reducing charge pump loading during the write operation using the high voltage, each of said at least two groups of bit cells have a common circuit connection separate from the other ones of said at least two groups of bits cells; and at least two selection circuits, each of said at least two selection circuits connected to the common circuit connection of a respective one of said at least two groups of bit cells, wherein said at least two selection circuits are adapted for selecting one of said at least two groups of bits cells when performing the write operation using the high voltage on at least one bit cell thereof, whereby the charge pump loading is reduced during the write operation using a high voltage.

2. The EEPROM of claim 1, wherein said common circuit connection is a common source connection.

3. The EEPROM of claim 2, wherein each of said at least two selection circuits comprises a selection transistor connected to a respective one of the common source connections of said at least two groups of bit cells.

4. The EEPROM of claim 1, wherein each of said plurality of bit cells comprises a storage transistor and a select transistor.

5. The EEPROM of claim 4, wherein said storage transistor comprises a floating gate and a cell gate, said floating gate being located between said cell gate, a source and a common drain/source.

6. The EEPROM of claim 5, wherein said select transistor comprises a select gate, a drain and the common drain/source.

7. The EEPROM of claim 6, wherein the source of said storage transistor is connected to the common source connection of a one of said at least two groups of bit cells.

8. The EEPROM of claim 7, wherein an electron charge is stored on the floating gate of said storage transistor by connecting the source of said storage transistor and the drain of said select transistor to a power supply common voltage, and applying a programming pulse to the cell gate and a row select gate.

9. The EEPROM of claim 7, wherein an electron charge on the floating gate of said storage transistor is discharged by connecting the cell gate to a power supply common voltage, floating the source of said storage transistor and applying a programming pulse to a row select gate and the drain of said select transistor.

10. The EEPROM of claim 1, wherein a programming pulse performs the write operation using the high voltage on said at least one bit cell.

11. The EEPROM of claim 10, wherein the programming pulse has a time duration of from about 0.1 to 10 milliseconds.

12. The EEPROM of claim 10, wherein the programming pulse has an amplitude of from about 21 to 25 volts.

13. The EEPROM of claim 10, further comprising another programming pulse that simultaneously performs the write operation using the high voltage on said at least one bit cell.

14. The EEPROM of claim 13, wherein the another programming pulse has an amplitude of from about 18 to 23 volts.

15. The EEPROM of claim 13, wherein the another programming pulse is derived from the programming pulse.

16. A method of reducing charge pump loading during a write operation using a high voltage for an electrically erasable and programmable read only memory (EEPROM), said method comprising the steps of:

dividing a plurality of memory bit cells into at least two groups of bit cells for reducing charge pump loading during the write operation using the high voltage, each of said at least two groups of bit cells having a common circuit connection separate from the other ones of said at least two groups of bit cells; and connecting each of at least two selection circuits to the common circuit connections of a respective one of said at least two groups of bit cells, wherein said at least two selection circuits are adapted for selecting one of said at least two groups of bits cells when performing the write operation using the high voltage on at least one bit cell thereof, whereby charge pump loading is reduced during the write operation using the high voltage.

17. The method of claim 16, wherein said common circuit connection is a common source connection.

18. The method of claim 17, wherein each of said at least two selection circuits comprises a selection transistor connected to a respective one of the common source connections of said at least two groups of bit cells.

19. The method of claim 16, wherein each of said plurality of bit cells comprises a storage transistor and a select transistor.

20. The method of claim 19, wherein said storage transistor comprises a floating gate and a cell gate, said floating gate being located between said cell gate, a source and a common drain/source.

21. The method of claim 20, wherein said select transistor comprises a select gate, a drain and the common drain/source.

22. The method of claim 21, wherein the source of said storage transistor is connected to the common source connection of a one of said at least two groups of bit cells.

23. The method of claim 22, wherein the step of storing an electron charge on the floating gate of said storage transistor comprises the steps of:

applying a power supply common voltage to the source of said storage transistor and the drain of said select transistor; and applying a programming pulse to the cell gate and a row select gate.

24. The method of claim 22, wherein the step of discharging an electron charge on the floating gate of said storage transistor comprises the steps of:

applying a power supply common voltage to the cell gate;

floating the source of said storage transistor; and applying a programming pulse to a row select gate and the drain of said select transistor.

25. The method of claim 16, wherein the step of performing the write operation using a high voltage on said at least one bit cell is done with a programming pulse.

26. The method of claim 25, wherein the programming pulse has a time duration of from about 0.1 to 10 milliseconds.

27. The method of claim 25, wherein the programming pulse has an amplitude of from about 21 to 25 volts.

28. The method of claim 25, wherein the step of performing the write operation using a high voltage on said at least one bit cell is further done with another programming pulse.

29. The method of claim 28, wherein the another programming pulse has an amplitude of from about 18 to 23 volts.

30. The method of claim 28, wherein the another programming pulse is derived from the programming pulse.

* * * * *